United States Patent
Coakley et al.

(10) Patent No.: US 11,876,312 B2
(45) Date of Patent: Jan. 16, 2024

(54) METHODS AND SYSTEMS FOR TERMINAL-FREE CIRCUIT CONNECTORS AND FLEXIBLE MULTILAYERED INTERCONNECT CIRCUITS

(71) Applicant: CelLink Corporation, San Carlos, CA (US)

(72) Inventors: Kevin Michael Coakley, Belmont, CA (US); Emily Hernandez, Belmont, CA (US); Mark Terlaak, Novi, MI (US)

(73) Assignee: CelLink Corporation, San Carlos, CA (US)

( * ) Notice: Subject to any disclaimer, the term of this patent is extended or adjusted under 35 U.S.C. 154(b) by 0 days.

(21) Appl. No.: 17/487,652

(22) Filed: Sep. 28, 2021

(65) Prior Publication Data

US 2022/0109256 A1    Apr. 7, 2022

Related U.S. Application Data

(60) Provisional application No. 63/086,876, filed on Oct. 2, 2020.

(51) Int. Cl.
| | |
|---|---|
| *H01R 12/77* | (2011.01) |
| *H01R 12/61* | (2011.01) |
| *H05K 1/11* | (2006.01) |

(52) U.S. Cl.
CPC ......... *H01R 12/613* (2013.01); *H01R 12/777* (2013.01); *H05K 1/118* (2013.01)

(58) Field of Classification Search
None
See application file for complete search history.

(56) References Cited

U.S. PATENT DOCUMENTS

| | | | |
|---|---|---|---|
| 3,750,278 A | | 8/1973 | Oberg et al. |
| 4,740,867 A | * | 4/1988 | Roberts ............ H01R 12/79 439/329 |

(Continued)

FOREIGN PATENT DOCUMENTS

| | | |
|---|---|---|
| CN | 203715762 U | 7/2014 |
| EP | 3496180 A1 | 6/2019 |

(Continued)

OTHER PUBLICATIONS

International Application Serial No. PCT/US21/52385, Search Report and Written Opinion dated Dec. 2, 2021, 7 pgs.

(Continued)

*Primary Examiner* — Felix O Figueroa
(74) *Attorney, Agent, or Firm* — Polygon IP, LLP

(57) ABSTRACT

A connector for connecting a flexible interconnect circuit includes a base, having a first set of protrusions and a second set of protrusions. The first set of protrusions and the second set of protrusions are configured to secure the flexible interconnect circuit at a first set of apertures and a second set of apertures of the flexible interconnect circuit, respectively. The first set of protrusions may be positioned at a first distance from the second set of protrusions on the base. The first set of apertures may be positioned on the flexible interconnect circuit at a second distance, greater than the first distance, from the second set of apertures. The base causes the flexible interconnect circuit into an arched configuration when the apertures are secured to the respective protrusions. The connector further includes a cover piece configured to secure the flexible interconnect circuit in the arched configuration.

20 Claims, 14 Drawing Sheets

(56) References Cited

U.S. PATENT DOCUMENTS

| | | | |
|---|---|---|---|
| 4,818,840 A | 4/1989 | Booth et al. | |
| 5,072,520 A | 12/1991 | Nelson | |
| 5,123,849 A | 6/1992 | Deak et al. | |
| 5,144,412 A | 9/1992 | Chang et al. | |
| 5,161,093 A | 11/1992 | Gorczyca et al. | |
| 5,262,594 A | 11/1993 | Edwin et al. | |
| 5,350,319 A * | 9/1994 | Roberts | H01R 12/79 439/325 |
| 5,382,759 A | 1/1995 | Lau et al. | |
| 5,452,182 A | 9/1995 | Eichelberger et al. | |
| 5,509,200 A | 4/1996 | Frankeny et al. | |
| 5,631,446 A | 5/1997 | Quan | |
| 5,645,932 A | 7/1997 | Uchibori | |
| 5,747,358 A | 5/1998 | Gorrell et al. | |
| 5,825,633 A | 10/1998 | Bujalski et al. | |
| 6,010,771 A | 1/2000 | Isen et al. | |
| 6,020,257 A | 2/2000 | Leedy | |
| 6,036,809 A | 3/2000 | Kelly et al. | |
| 6,232,157 B1 | 5/2001 | Dodabalapur et al. | |
| 6,332,909 B1 | 12/2001 | Teshima et al. | |
| 6,464,532 B1 * | 10/2002 | L'Abbate | H01R 12/772 439/499 |
| 6,787,732 B1 | 9/2004 | Xuan et al. | |
| 6,830,460 B1 | 12/2004 | Rathburn | |
| 6,881,923 B2 | 4/2005 | Battaglia | |
| 6,992,001 B1 | 1/2006 | Lin | |
| 7,144,256 B2 | 12/2006 | Pabst et al. | |
| 7,232,334 B2 | 6/2007 | Shimizu et al. | |
| 7,497,004 B2 | 3/2009 | Cote et al. | |
| 7,633,035 B2 | 12/2009 | Kirmeier | |
| 8,510,934 B2 | 8/2013 | Brand et al. | |
| 8,931,166 B2 | 1/2015 | Marttila | |
| 9,214,607 B1 | 12/2015 | Andrews | |
| 9,276,336 B2 | 3/2016 | Rathburn | |
| 9,350,093 B2 | 5/2016 | Rathburn | |
| 9,671,352 B2 | 6/2017 | Woo et al. | |
| 9,692,030 B2 | 6/2017 | Schüssler et al. | |
| 9,730,333 B2 | 8/2017 | Li et al. | |
| 10,008,403 B2 | 6/2018 | Rumsby | |
| 11,404,836 B2 * | 8/2022 | Peterson | H01R 12/774 |
| 2001/0006766 A1 | 7/2001 | O'Brien et al. | |
| 2002/0046856 A1 | 4/2002 | Alcoe | |
| 2002/0050489 A1 | 5/2002 | Ikegami et al. | |
| 2003/0062347 A1 | 4/2003 | Song et al. | |
| 2003/0223535 A1 | 12/2003 | Leedy | |
| 2004/0029411 A1 | 2/2004 | Rathburn | |
| 2004/0252477 A1 | 12/2004 | Brown et al. | |
| 2004/0253845 A1 | 12/2004 | Brown et al. | |
| 2004/0253846 A1 | 12/2004 | Brown et al. | |
| 2004/0253875 A1 | 12/2004 | Brown et al. | |
| 2005/0051841 A1 | 3/2005 | Leedy | |
| 2005/0164527 A1 | 7/2005 | Radza et al. | |
| 2005/0269693 A1 | 12/2005 | Green et al. | |
| 2006/0032665 A1 | 2/2006 | Ice | |
| 2006/0116004 A1 | 6/2006 | Rathburn | |
| 2007/0171129 A1 | 7/2007 | Coleman et al. | |
| 2007/0193027 A1 | 8/2007 | Takakusaki et al. | |
| 2008/0017971 A1 | 1/2008 | Hollis | |
| 2008/0083715 A1 | 4/2008 | Kirmeier | |
| 2008/0128397 A1 | 6/2008 | Gandhi | |
| 2008/0274654 A1 | 11/2008 | Yasumura et al. | |
| 2009/0007421 A1 | 1/2009 | Chen et al. | |
| 2010/0031996 A1 | 2/2010 | Basol | |
| 2011/0001670 A1 | 1/2011 | Coleman et al. | |
| 2011/0089212 A1 | 4/2011 | Schmid et al. | |
| 2012/0164490 A1 | 6/2012 | Itoi et al. | |
| 2012/0171527 A1 | 7/2012 | Hiroma | |
| 2012/0227907 A1 | 9/2012 | Arakawa et al. | |
| 2013/0055555 A1 | 3/2013 | Forster et al. | |
| 2013/0260191 A1 | 10/2013 | Takahashi et al. | |
| 2014/0268780 A1 | 9/2014 | Wang et al. | |
| 2015/0023584 A1 | 1/2015 | Rudin | |
| 2015/0126049 A1 | 5/2015 | Lhommeau et al. | |
| 2015/0173183 A1 | 6/2015 | Holec et al. | |
| 2015/0228956 A1 | 8/2015 | Schüssler et al. | |
| 2015/0270190 A1 | 9/2015 | Kim et al. | |
| 2016/0181579 A1 | 6/2016 | Geshi et al. | |
| 2016/0207287 A1 | 7/2016 | Kim | |
| 2016/0225969 A1 | 8/2016 | Coakley et al. | |
| 2016/0315304 A1 | 10/2016 | Biskup | |
| 2016/0366768 A1 | 12/2016 | Matsuda | |
| 2017/0012331 A1 | 1/2017 | Ng et al. | |
| 2017/0077487 A1 | 3/2017 | Coakley et al. | |
| 2017/0214033 A1 | 7/2017 | Takano et al. | |
| 2018/0034023 A1 | 2/2018 | Newman et al. | |
| 2018/0205048 A1 | 7/2018 | Enomoto et al. | |
| 2018/0294536 A1 | 10/2018 | Kruszelnicki | |
| 2019/0045625 A1 | 2/2019 | Kong et al. | |
| 2019/0097204 A1 | 3/2019 | Liposky et al. | |
| 2019/0181419 A1 | 6/2019 | Suba et al. | |
| 2019/0218142 A1 | 7/2019 | Logunov et al. | |
| 2019/0296281 A1 | 9/2019 | Elsberry | |
| 2019/0312251 A1 | 10/2019 | Matthews | |
| 2019/0341585 A1 | 11/2019 | Shi et al. | |
| 2020/0137882 A1 | 4/2020 | Coakley et al. | |
| 2020/0220120 A1 | 7/2020 | Day et al. | |
| 2021/0257758 A1 | 8/2021 | Stefano et al. | |

FOREIGN PATENT DOCUMENTS

| | | |
|---|---|---|
| GB | 2014368 A | 8/1979 |
| JP | 3970547 B2 | 9/2007 |
| KR | 20150058939 A | 5/2015 |
| RU | 2072119 C1 | 1/1997 |
| RU | 2476964 C2 | 2/2013 |
| WO | 2019150740 A1 | 8/2019 |

OTHER PUBLICATIONS

International Application Serial No. PCT/US21/53243, Search Report and Written Opinion dated Nov. 25, 2021, 8 pgs.

Nagarajan Palavesam et al; "Roll-to-roll processing of film substrates for hybrid integrated flexible electronics" Flexible and Printed Electronics, Feb. 2018.

* cited by examiner

METHODS AND SYSTEMS FOR TERMINAL-FREE CIRCUIT CONNECTORS AND FLEXIBLE MULTILAYERED INTERCONNECT CIRCUITS

CROSS-REFERENCE TO RELATED APPLICATIONS

This application claims the benefit under 35 U.S.C. § 119(e) of U.S. Provisional Patent Application No. 63/086, 876, entitled: "METHODS AND SYSTEMS FOR TERMINAL-FREE CIRCUIT CONNECTORS AND FLEXIBLE MULTILAYERED INTERCONNECT CIRCUITS" filed on Oct. 2, 2020, which is incorporated herein by reference in its entirety for all purposes.

BACKGROUND

Electrical power and control signals are typically transmitted to individual components of a vehicle or any other machinery or system using multiple wires bundled together in a harness. In a conventional harness, each wire may have a round cross-sectional profile and may be individually surrounded by an insulating sleeve. The cross-sectional size of each wire is selected based on the material and current transmitted by this wire. Furthermore, resistive heating and thermal dissipation are a concern during electrical power transmission requiring even larger cross-sectional sizes of wires in a conventional harness. Additionally, traditional connectors for joining the interconnect circuits with the individual components may be rather bulky, heavy, and expensive to manufacture. Yet, automotive, aerospace and other industries strive for smaller, lighter, and less expensive components.

What is needed are terminal-free connectors and circuits comprising terminal-free connectors that are lighter and cheaper to manufacture, and which may be configured for flexible interconnect circuits that do not include traditional round cross-sectional profiles.

SUMMARY

The following presents a simplified summary of the disclosure in order to provide a basic understanding of certain s elements of this disclosure. This summary is not an extensive overview of the disclosure, and it does not identify key and critical elements of the present disclosure or delineate the scope of the present disclosure. Its sole purpose is to present some concepts disclosed herein in a simplified form as a prelude to the more detailed description that is presented later.

Provided are terminal-free connectors and circuits comprising terminal-free connectors. In particular, a connector for connecting a flexible interconnect circuit comprises a base comprising a first set of protrusions and a second set of protrusions. The first set of protrusions is configured to secure the flexible interconnect circuit at a first set of apertures within the flexible interconnect circuit. The second set of protrusions is configured to secure the flexible interconnect circuit at a second set of apertures within the flexible interconnect circuit. The base causes the flexible interconnect circuit into an arched configuration when the first set of apertures and the second set of apertures are secured to the first set of protrusions and the second set of protrusions, respectively. The connector further comprises a cover piece configured to secure the flexible interconnect circuit in the arched configuration.

The first set of protrusions may be positioned on the base at a first distance from the second set of protrusions. The first set of apertures may be positioned on the flexible interconnect circuit at a second distance from the second set of apertures. The second distance may be greater than the first distance.

The cover piece may include a first clamp structure and a second clamp structure. The first clamp structure may be configured to interface with the first set of protrusions to secure the flexible interconnect circuit in the connector, and the second clamp structure may be configured to interface with the second set of protrusions to secure the flexible interconnect circuit in the connector. The first clamp structure may include a geometry configured to contact a portion of the flexible interconnect circuit located between the first set of protrusions and the second set of protrusions, and increase a height of the arched configuration. The cover piece may be coupled to the base via a hinge, and the cover piece may be configured to move about the hinge between an open position and a closed position.

The connector may comprise one or more blade openings configured to receive one or more blades of a module-side connector. The one or more blade openings may be positioned through the cover piece. The arched configuration of the flexible interconnect circuit may urge a conductive surface of the flexible interconnect surface against the one or more blades of the module-side connector.

The cover piece may comprise a contact surface having a surface geometry configured to urge the one or more blades of the module-side connector against the flexible interconnect circuit.

Each aperture of the first set of apertures may include a first shape corresponding to a first cross-sectional geometry of each protrusion of the first set of protrusions. Each aperture of the second set of apertures may include a second shape corresponding to a second cross-sectional geometry of each protrusion of the second set of protrusions. The first shape and second shape may be different shapes.

Also provided is a connector comprising a base and a cover piece. The base comprises an insertion cavity configured to receive the flexible interconnect circuit, and a first set of protrusions configured to secure the flexible interconnect circuit at a first set of apertures within the flexible interconnect circuit. The base causes the flexible interconnect circuit into an arched configuration when the flexible interconnect circuit is within the insertion cavity and secured to the first set of protrusions. The cover piece is configured to secure the flexible interconnect circuit in the arched configuration.

The cover piece may include a first clamp structure configured to interface with the first set of protrusions to secure the flexible interconnect circuit in the connector. The cover piece may be coupled to the base via a hinge. The cover piece may be configured to move about the hinge between an open position and a closed position.

The connector may comprise one or more blade openings configured to receive one or more blades of a module-side connector. The cover piece may comprise a contact surface having a surface geometry configured to urge the one or more blades of the module-side connector against the flexible interconnect circuit.

Also provided is a connector comprising a base structure and a terminal position assurance (TPA) device. The base structure comprises a housing chamber defined by at least a bottom wall, and an insertion cavity within the housing chamber. The insertion cavity is configured to receive the flexible interconnect circuit. The TPA device is configured to interface with the base structure in a secured position. The TPA device comprises a plurality of pins positioned on the interface surface of the TPA device. The plurality of pins extends into the housing chamber in the secured position to urge the flexible interconnect circuit into an arched configuration.

The base structure may further comprise an upper wall defining the housing chamber, the upper wall may comprise a plurality of openings, the interface surface of the TPA device may be configured to interface with an external surface of the upper wall in the secured position, and the plurality of pins may be configured to pass through the plurality of openings in the secured position. The TPA device may be coupled to the base structure via a hinge, and may be configured to move about the hinge between an open position and the secured position.

The base structure may further one or more blade openings configured to receive one or more blades of a module-side connector. The connector may further comprise a contact surface having a surface geometry configured to urge the one or more blades of the module-side connector against the flexible interconnect circuit.

These and other examples are described further below with reference to the figures.

DETAILED DESCRIPTION

In the following description, numerous specific details are outlined to provide a thorough understanding of the presented concepts. In some examples, the presented concepts are practiced without some or all of these specific details. In other examples, well-known process operations have not been described in detail to unnecessarily obscure the described concepts. While some concepts will be described in conjunction with the specific examples, it will be understood that these examples are not intended to be limiting.

FIGS. 1A, 1B, 2, 3, 4, and 5—Flexible Interconnect Circuits

Interconnect circuits are used to deliver power and/or signals and used for various applications, such as vehicles, appliances, electronics, and the like. One example of such interconnect circuits is a harness, which typically utilizes electrical conductors having round or rectangular cross-sectional profiles. In a harness, each electrical conductor may be a solid round wire or a stranded set of small round wires. A polymer shell insulates each electrical conductor. Furthermore, multiple insulated electrical conductors may form a large bundle.

Figure 1A:
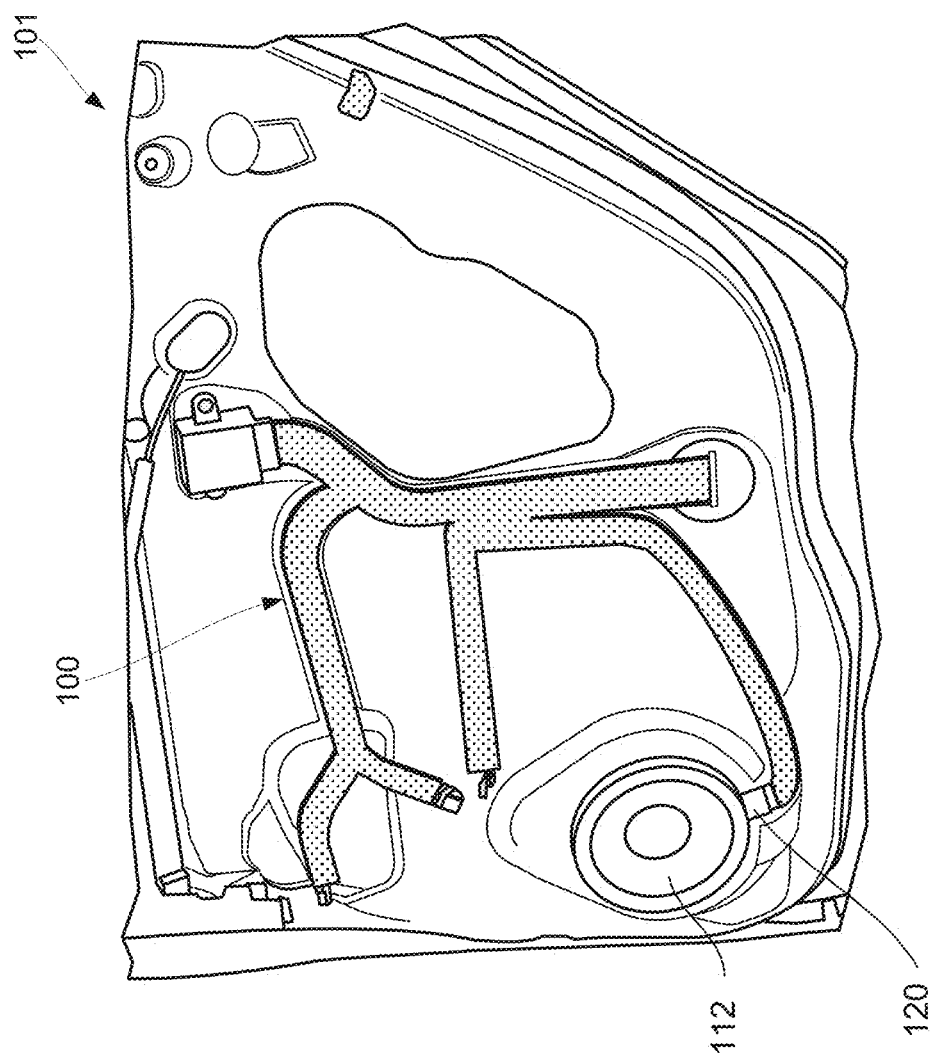
FIG. 1A is a schematic illustration of one example of a flexible hybrid interconnect circuit used in an assembly, in accordance with one or more embodiments.

FIG. 1A is a schematic illustration of one example of flexible hybrid interconnect circuit 100 used in assembly 101. As used herein, a flexible hybrid interconnect circuit may be referred to as a "flex circuit." While assembly 101 is shown as a car door, one having ordinary skill in the art would understand that various other types of vehicle panels (e.g., roof panels, floor panels) and types of vehicles (e.g., aircraft, watercraft) are also within the scope. Furthermore, flexible hybrid interconnect circuit 100 may be a part of or attached to other types of structures (e.g., battery housing), which may be operable as heat sinks or heat spreaders. For example, flexible hybrid interconnect circuit 100 may be used for various appliances (e.g., refrigerators, washers/dryers, heating, ventilation, and air conditioning), aircraft wiring, battery interconnects, and the like.

Provided are novel aspects of securing a flex circuit, such as flex circuit 100, to the male pins (also known as "blades") of an automotive connector without the need for female metal terminals within a female connector. As used herein, an automotive connector may be referred to as a "module-side connector" and a female connector may be referred to as a "circuit-side connector." The elimination of female metal terminals from the system has the potential to reduce weight, size, and cost of a flexible harness. Furthermore, in some examples, the elimination of female terminals provides a much simpler path to making a flex harness backward compatible with a round wire harness. For example, 3D printing may be used to produce a semi-custom female plastic connector that mates with a given male plastic connector.

Securing functions of the certain flex circuits described herein may be based exclusively on a plastic component (and no female metal terminals). The securing functions involve (1) securing the flexible circuit to a female connector housing, (2) securing the female connector housing to a male connector housing, and (3) securing the flex circuit to the male connector pins. Various features of flexible circuits, described herein, provide these securing functions. It should be noted that these three securing functions are provided by the same component, which may be referred to as a connector housing. In some examples, the connector housing may be an assembly of two or more plastic subcomponents.

Specifically, the connector housing forms one or more latch systems, such that each of these three securing functions is accomplished by a separate latch system. In some examples, the number of latch systems, needed to accomplish these three securing functions is two or even one.

Figure 1B:
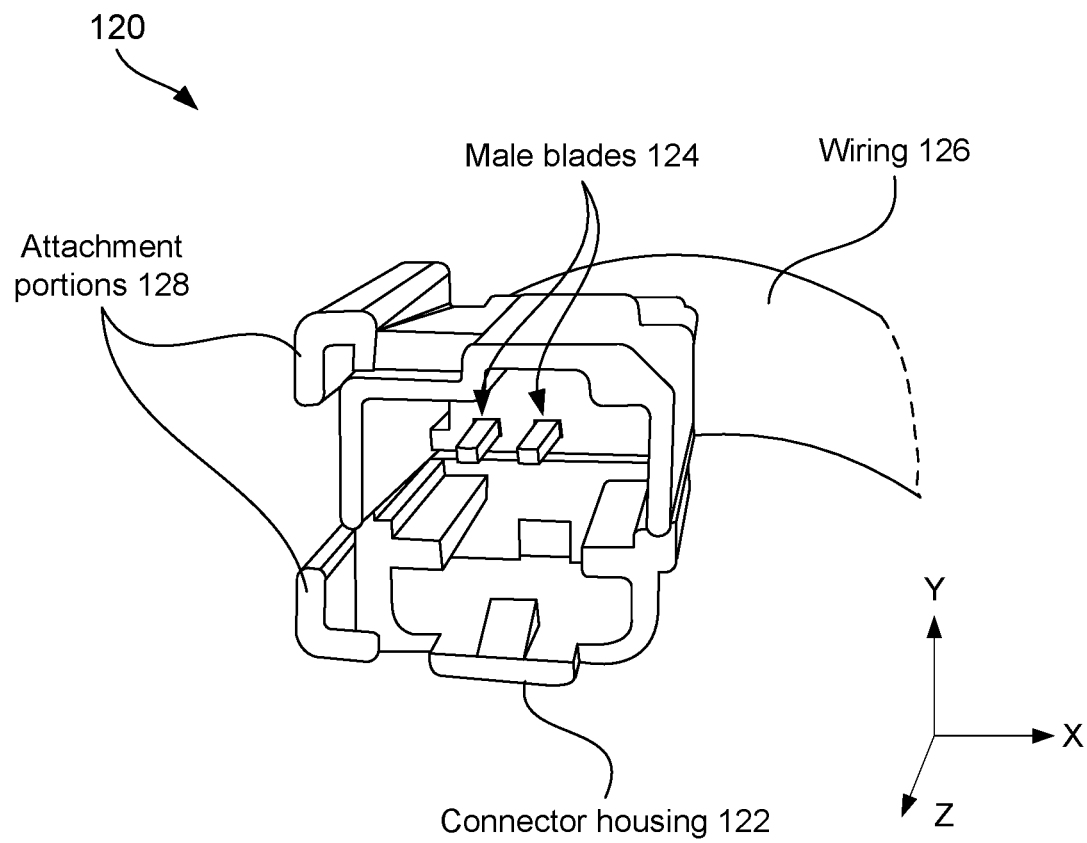
FIG. 1B is an example of a module-side connector, which may terminate wires or attach to a printed circuit board.

As an illustrative example, assembly 101 may comprise speaker system 112 which includes a module-side connector 120. FIG. 1B illustrates an example of a module-side connector, which may terminate wires 126 or be attached to a printed circuit board (PCB). Module-side connector 120 is a male connector that includes male pins or blades 124 within a module-side connector housing 122. Housing 122 may include attachment portions 128 for securing onto a structure, such as a door panel. Typically, module-side connector 120 is configured to interface with a circuit-side connector such that blades 124 are inserted into female metal terminals of the circuit-side connector. In existing systems, such female metal terminals would be first coupled to a flex circuit within a circuit-side housing.

As noted above, the need to add metal terminals to flex circuits for mechanically and electrically connecting to a mating metal pin greatly increases weight, size, and costs, which substantially limits the use of various flexible circuits in automotive and other like applications. In some examples, these terminals may not be needed, because the flexible circuit traces of the flex circuit can be designed to be perfectly aligned with the male pins (aka "blades") of a module-side connector.

Described herein are methods and designs which provide the electrical and mechanical attachment of a terminal-free flexible circuit to the male blades of a mating terminal. A specially configured connector housing is used. In some examples, the connector housing is formed from one or more plastic materials described below.

It should be noted that 90% or more of all mating terminals in automotive applications use male blades. As such, the following description focuses on female connectors. However, one having ordinary skill in the art would understand that many described features are also applicable to male connectors, which are also within the scope of this disclosure.

Figure 2:
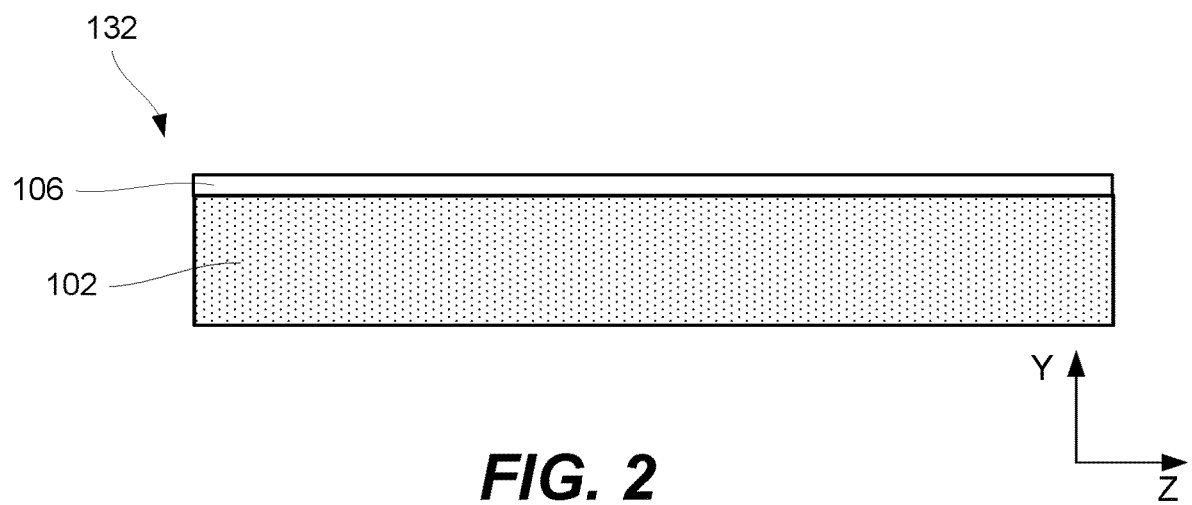
FIGS. 2, 3, and 4 are examples of conductive elements for use in signal transmission portions and/or power transmission portions of flexible hybrid interconnect circuits.
Figure 3:
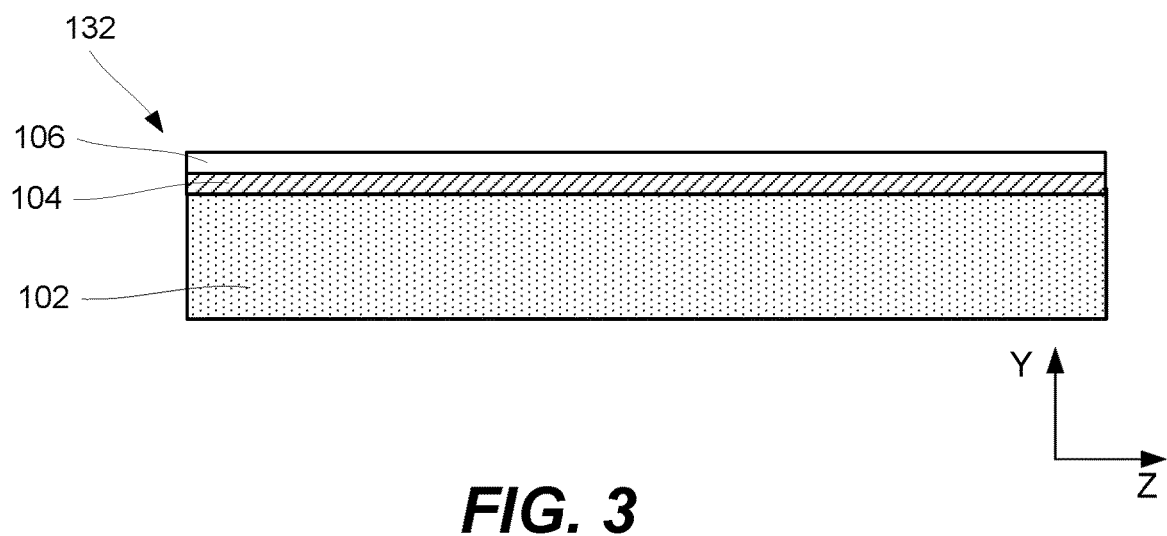
Figure 4:
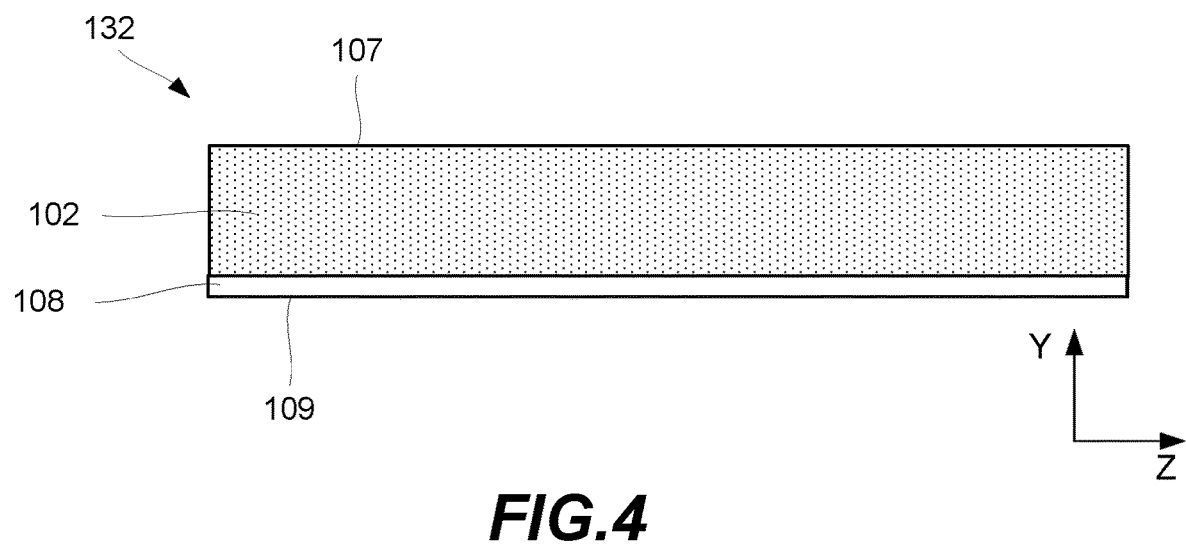

In some examples, one or more conductive elements of flexible hybrid interconnect circuit 100 comprise a base sublayer and a surface sublayer. For example, FIGS. 2, 3, and 4 illustrate various examples of signal line 132. However, these examples are also applicable to any other conductive element. The depicted signal line 132 may be a cross-sectional view of a flexible interconnect circuit 100. As shown in FIG. 2, signal line 132 comprises base sublayer 102 and surface sublayer 106, such that surface sublayer 106 may have a different composition than base sublayer 102. A dielectric may be laminated over surface sublayer 106. More specifically, at least a portion of surface sublayer 106 may directly interface a dielectric (or an adhesive used for attaching these dielectrics). Surface sublayer 106 may be specifically selected to improve adhesion of the dielectric to signal line 132, and/or other purposes as described below.

Base sublayer 102 may comprise a metal selected from a group consisting of aluminum, titanium, nickel, copper, and steel, and alloys comprising these metals. The material of base sublayer 102 may be selected to achieve desired electrical and thermal conductivities of signal line 132 (or another conductive element) while maintaining minimal cost.

Surface sublayer 106 may comprise a metal selected from the group consisting of tin, lead, zinc, nickel, silver, palladium, platinum, gold, indium, tungsten, molybdenum, chrome, copper, alloys thereof, organic solderability preservative (OSP), or other electrically conductive materials. The material of surface sublayer 106 may be selected to protect base sublayer 102 from oxidation, improve surface conductivity when forming electrical and/or thermal contact to device, improve adhesion to signal line 132 (or another conductive element), and/or other purposes. Furthermore, in some examples, the addition of a coating of OSP on top of surface sublayer 106 may help prevent surface sublayer 106 itself from oxidizing over time.

For example, aluminum may be used for base sublayer 102. While aluminum has a good thermal and electrical conductivity, it forms a surface oxide when exposed to air. Aluminum oxide has poor electrical conductivity and may not be desirable at the interface between signal line 132 and other components making an electrical connection to signal line 132. In addition, in the absence of a suitable surface sublayer, achieving good, uniform adhesion between the surface oxide of aluminum and many adhesive layers may be challenging. Therefore, coating aluminum with one of tin, lead, zinc, nickel, silver, palladium, platinum, gold, indium, tungsten, molybdenum, chrome, or copper before aluminum oxide is formed mitigates this problem and allows using aluminum as base sublayer 102 without compromising electrical conductivity or adhesion between signal line 132 (or another conductive element) and other components of flexible hybrid interconnect circuit 100.

Surface sublayer 106 may have a thickness of between about 0.01 micrometers and 10 micrometers or, more specifically, between about 0.1 micrometers and 1 micrometer. For comparison, thickness of base sublayer 102 may be between about 10 micrometers and 1000 micrometers or, more specifically, between about 100 micrometers and 500 micrometers. As such, base sublayer 102 may represent at least about 90% or, more specifically, at least about 95% or even at least about 99% of signal line 132 (or another conductive element) by volume.

While some of surface sublayer 106 may be laminated to an insulator, a portion of surface sublayer 106 may remain exposed. This portion may be used to form electrical and/or thermal contacts between signal line 132 to other components.

In some examples, signal line 132 (or another conductive element) further comprises one or more intermediate sublayers 104 disposed between base sublayer 102 and surface sublayer 106 as, for example, shown in FIG. 3. Intermediate sublayer 104 has a different composition than base sublayer 102 and surface sublayer 106. In some examples, the one or more intermediate sublayers 104 may help prevent intermetallic formation between base sublayer 102 and surface sublayer 106. For example, intermediate sublayer 104 may comprise a metal selected from a group consisting of chromium, titanium, nickel, vanadium, zinc, and copper.

In some examples, signal line 132 (or another conductive element) may comprise rolled metal foil. In contrast to the vertical grain structure associated with electrodeposited foil and/or plated metal, the horizontally-elongated grain structure of rolled metal foil may help increase the resistance to crack propagation in conductive elements under cyclical loading conditions. This may help increase the fatigue life of flexible hybrid interconnect circuit 100.

In some examples, signal line 132 (or another conductive element) comprises electrically insulating coating 108, which forms surface 109 of signal line 132, disposed opposite of conductive surface 107 as shown, for example, in FIG. 4. At least a portion of this surface 109 may remain exposed in flexible hybrid interconnect circuit 100 and may be used for heat removal from flexible hybrid interconnect circuit 100. In some examples, the entire surface 109 remains exposed in flexible hybrid interconnect circuit 100. Insulating coating 108 may be selected for relatively high thermal conductivity and relatively high electrical resistivity and may comprise a material selected from a group consisting of silicon dioxide, silicon nitride, anodized alumina, aluminum oxide, boron nitride, aluminum nitride, diamond, and silicon carbide. Alternatively, insulating coating may comprise a composite material such as a polymer matrix loaded with thermally conductive, electrically insulating inorganic particles.

In some examples, a conductive element is solderable. When a conductive element includes aluminum, the aluminum may be positioned as base sublayer 102, while surface sublayer 106 may be made from a material having a melting temperature that is above the melting temperature of the solder. Otherwise, if surface sublayer 106 melts during circuit bonding, oxygen may penetrate through surface sublayer 106 and oxidize aluminum within base sublayer 102. This in turn may reduce the conductivity at the interface of the two sublayers and potentially cause a loss of mechanical adhesion. Hence, for many solders that are applied at temperatures ranging from 150-300° C., surface sublayer 106 may be formed from zinc, silver, palladium, platinum, copper, nickel, chrome, tungsten, molybdenum, or gold. In some examples, e.g., in cases in which a high-frequency signal is to be transmitted down the signal line, the surface sublayer composition and thickness may be chosen in order to minimize resistance losses due to the skin effect.

Figure 5:
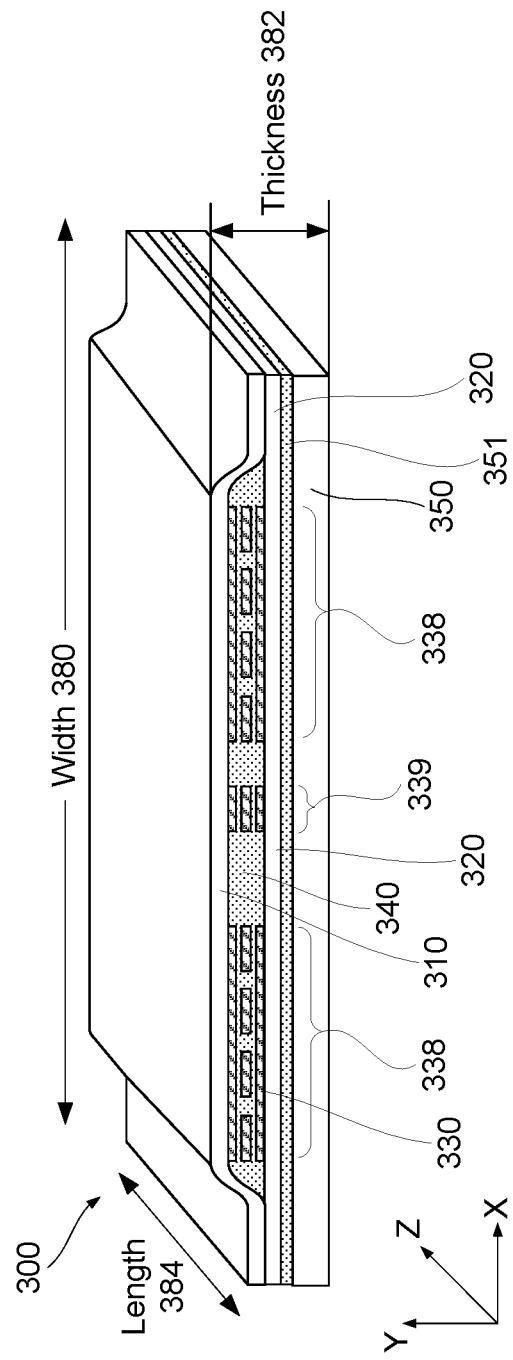
FIG. 5 is a schematic cross-sectional view of flexible multilayered interconnect circuit, in accordance with one or more embodiments.

FIG. 5 is a schematic cross-sectional view of flexible multilayered interconnect circuit 300. This view identifies, in general, the width 380 (extending along the X-axis), thickness 382 (along the Y-axis), and length 384 (along the Z-axis) of circuit 300. One having ordinary skill in the art would understand that flexible multilayered interconnect circuit 300 will change its orientation as circuit 300 flexes. Specifically, flexible hybrid interconnect circuit 100 may bend around any one of the identified axes during its production, handling, installation and/or operation, and the orientation of the width, thickness, and length may change and may be different at different locations of flexible hybrid interconnect circuit 100.

Referring to FIG. 5, flexible multilayered interconnect circuit 300 comprises first outer dielectric 310 and second outer dielectric 320. The outer dielectrics collectively seal various internal components of flexible multilayered interconnect circuit 300.

Furthermore, FIG. 5 illustrates flexible multilayered interconnect circuit 300 comprising conductors 330, stacked between first outer dielectric 310 and second outer dielectric 320 along the thickness of flexible multilayered interconnect circuit 300 (the Y direction). While FIG. 5 illustrates a 3-layered stack, one having ordinary skill in the art would understand that a stack may be formed by any number of layers (e.g., two, three, four, or more). It should also be understood by one having ordinary skill in the art that the systems and methods described herein may also be implemented with a stack comprising of one layer of conductive material supported by an inner dielectric material. Conductors 330 are supported with respect to each other by inner dielectric 340.

In some examples, conductors 330 are grouped together within circuit 300, forming different portions of circuit 300, such as signal transmission portions 338 and power transmission portion 339. Each portion comprises one or more conductors 330. Conductors 330 in each portion are specifically configured and arranged to provide various functions, such as transmitting high-frequency signals while shielding one or signal lines, transmitting power, and the like.

In some examples, flexible hybrid interconnect circuit 100 is attached to panel 350 (or any other supporting structure or a heat sink) using adhesive layer 351 or, more specifically, a thermally conductive adhesive layer. It should be noted that while, in some examples, adhesive layer 351 is a part of flexible multilayered interconnect circuit 300, body panel 350 is not be a part of circuit 300

FIGS. 6A-6F, 7A-7C, and 8A-8G—Connector Examples

FIGS. 6A-6F illustrate various cross-sectional views of a circuit-side connector system 600, in accordance with one or more embodiments. According to various embodiments, circuit-side connector system 600 comprises a connector with base 610. Base 610 may include one or more protrusions configured to secure a flexible interconnect circuit onto the connector.

As shown, base 610 includes two sets of protrusions, including a first set of protrusions 612-A and a second set of protrusions 612-B. The protrusions of each set of protrusions are positioned at opposite sides of base 610. The first set of protrusions may be positioned a distance A from the second set of protrusions on each side. In some embodiments, base 610 may include side walls 614. Side walls 614 may be configured to guide or constrain the positioning of a flex circuit within the base. However, in some embodiments, based 610 is configured without side walls 614.

Figure 6A:
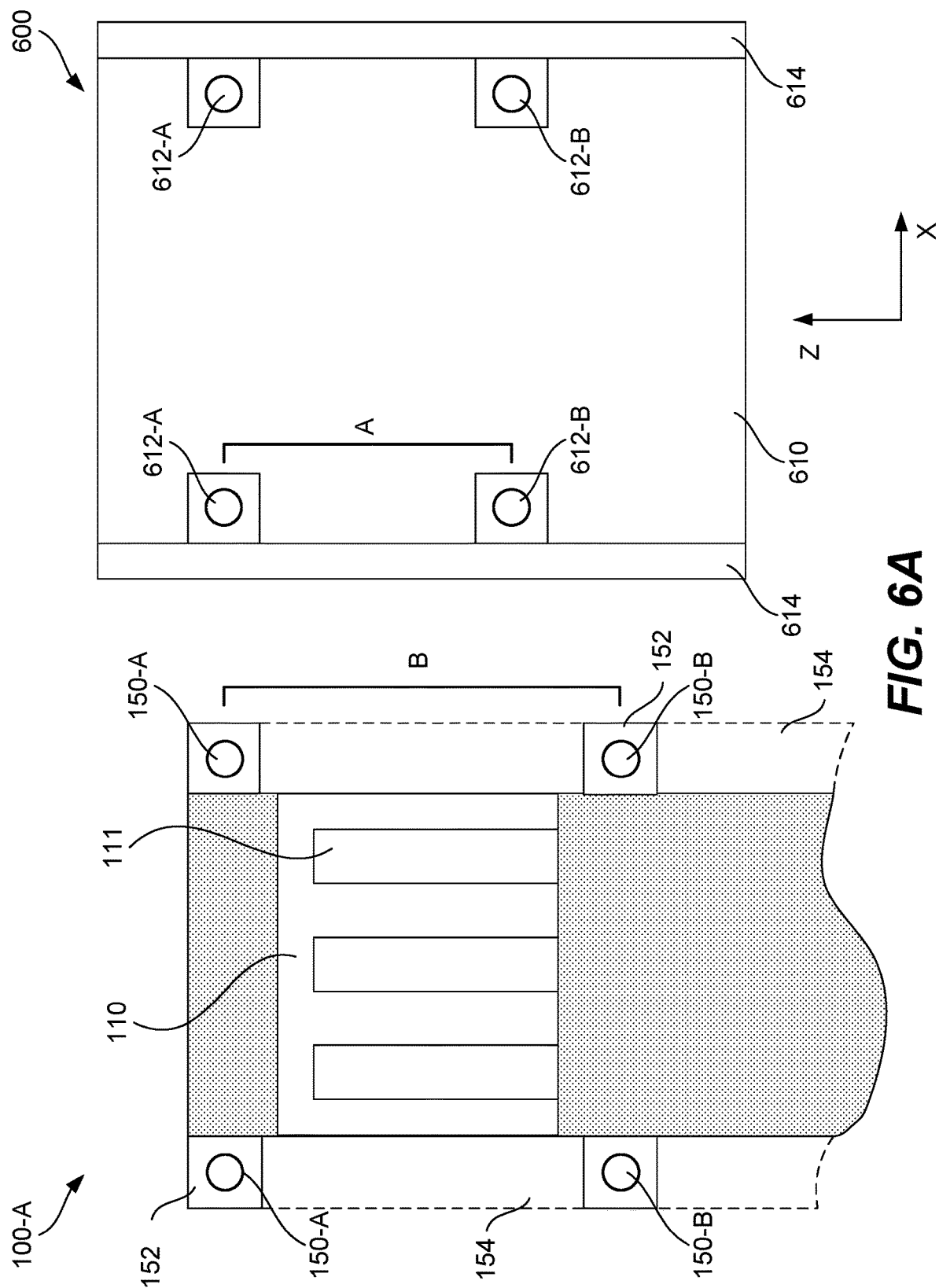
FIGS. 6A, 6B, 6C, 6D, 6E, and 6F illustrate various cross-sectional views of a circuit-side connector, in accordance with one or more embodiments.

Flex circuit 100-A, shown in FIG. 6A, may be configured to be implemented with connector 600. Flex circuit 100-A may be flex circuit 300. Flex circuit 100-A may include a conductive surface 110 configured to form an electrical connection with a male blade of a module-side connector. The conductive surface may include one or more exposed conductive surfaces or portions 111. Flex circuit 100-A may include one or more sets of apertures or openings formed through all layers of the flex circuit. These apertures may be formed using various techniques, such as etching, die-cutting, and laser cutting. As shown, flex circuit 100-A includes a first set of apertures 150-A and a second set of apertures 150-B. In various embodiments, apertures 150-A are configured to interface with protrusions 612-A and apertures 150-B are configured to interface with protrusions 612-B. The first set of apertures may be positioned a distance B from the second set of apertures. According to various embodiments, distance B is greater than distance A.

The apertures may be positioned on the side edges of the flex circuit within ribbons or strips 154 of material on either side of the flex circuit. Strips 154 may be monolithic with the material used to form the flex circuit. In some embodiments, strips 154 may include any one of the materials described with reference to base sublayer 102, intermediate sublayers 104, and surface sublayer 106. In other words, strips 154 may or may not include conductive material. In some embodiments, one or more portions of strips 154 may be removed during or after production of flex circuit 100-A (shown as dashed lined) leaving tabs 152 that include apertures.

In some embodiments, the shapes of the first set of apertures 150-A are configured to match the cross-sectional geometry of protrusions 612-A and the shapes of the second set of apertures 150-B are configured to match the cross-sectional geometry of protrusions 612-B. In some embodiments, the geometric profiles of protrusions 612-A (and apertures 150-A) and protrusions 612-B (and apertures 150-B) are the same. In some embodiments, the geometries of protrusions 612-A (and apertures 150-A) are different from those of protrusions 612-B (and apertures 150-B) in order to restrict interfacing options or avoid interfacing with incorrect apertures.

Figure 6B:
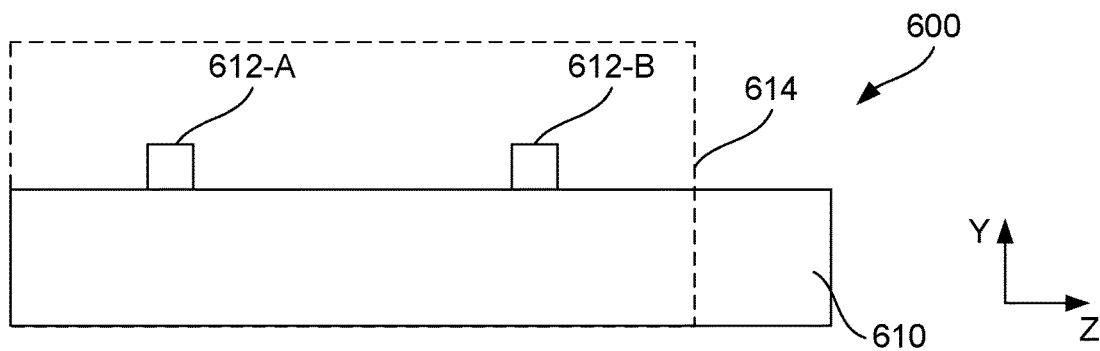
Figure 6C:
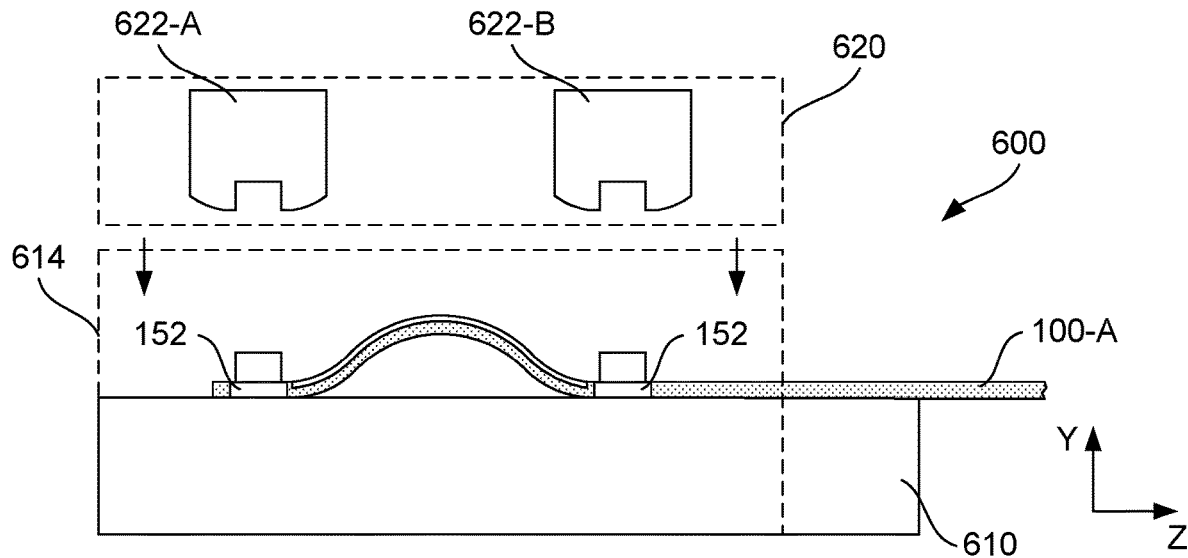
Figure 6D:
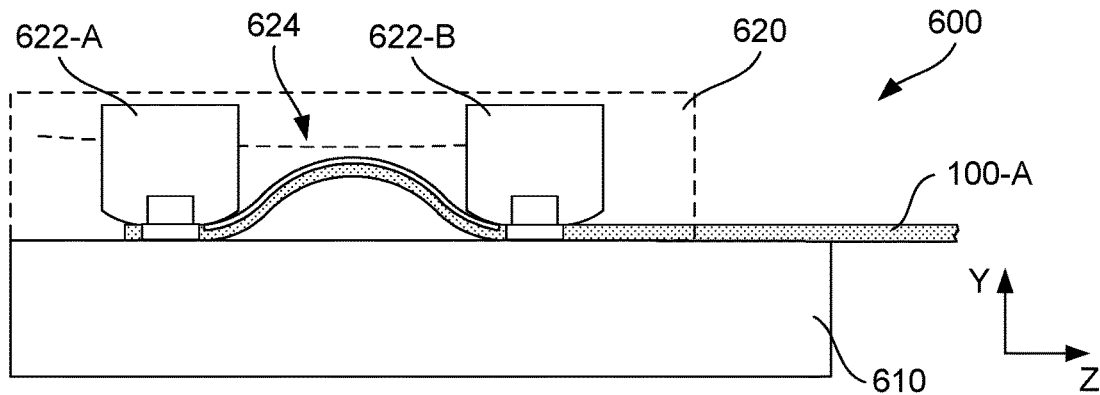

FIGS. 6B, 6C, and 6D show a cross-sectional side view of connector system 600. Side walls 614 of base 610 are shown in dashed lines in FIG. 6B and 6C. In FIG. 6C, flex circuit 100-A is loaded onto the protrusions on base 610. Because distance B between the apertures (150-A and 150-B) is greater than the distance A between the protrusions (612-A and 612-B), the material of flex circuit between sets of apertures (150-A and 150-B) is forced into an arched configuration when the apertures are interfaced with the respective protrusions. Tabs 152 in FIGS. 6C and 6D indicate the position of the apertures.

As further shown in FIG. 6C, connector system 600 may further comprise cover piece 620. Cover piece 620 may include clamp structures 622-A and 622-B configured to interface with protrusions 612-A and 612-B, respectively. In some embodiments, each clamp structure may extend across the width of base 610 from one aperture to the other in each set of apertures. However, there may be a separate clamp structure implemented for each protrusion. A cross-section of cover piece 620 is illustrated in FIGS. 6C and 6D with exterior in dashed lines to show the clamp structures within. In some embodiments, cover piece 620 is configured to securely interface with base 610. Various attachment mechanisms may be implemented to secure the cover portion onto the base. For example, interfacing snaps, locks, or latches may be implemented between the cover portion and base 610 or side walls 614.

Once securely interfaced, the clamp structures may secure flex circuit 100-A in the arched configuration on the protrusions of base 610. In some embodiments, the clamp structures may include a surface geometry which additionally forces the material of the flex circuit medially between the clamp structures, which may further increase the height of the arched configuration of the flex circuit. For example, each clamp structure may include a surface extending medially toward the area between the two sets of protrusions. This additional material may push a portion of the flex circuit located between the two sets of protrusions downward, which may then increase the height of the raised portion of the flex circuit in the arched configuration.

Figure 6E:
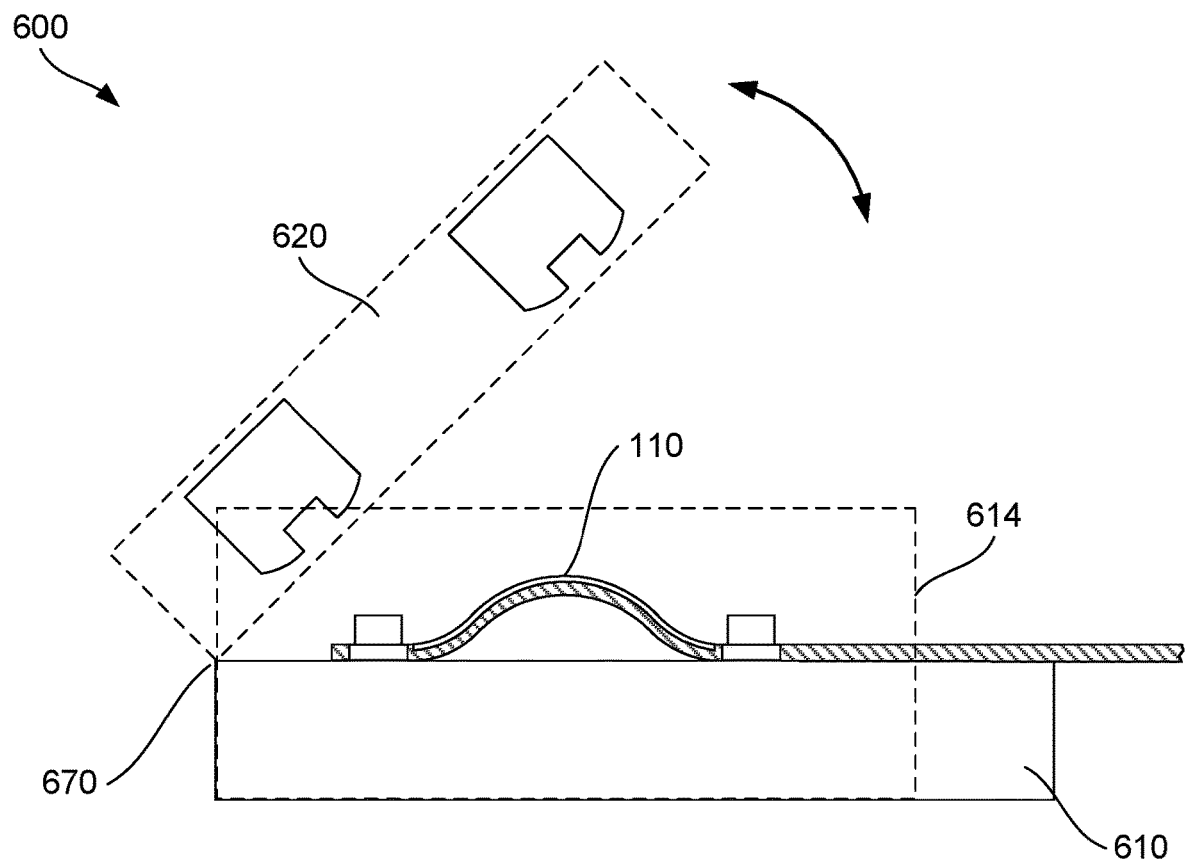

FIG. 6E illustrates another embodiment of connector 600 in which cover piece 620 is movably coupled to base 610 between an open position and a closed position. For example, cover piece 620 may be coupled to base 610 via hinge mechanism 670, such as a living hinge. This provides a connector of a single structure for loading of the flex circuit. As such, the connector may be a monolithic structure.

Figure 6F:
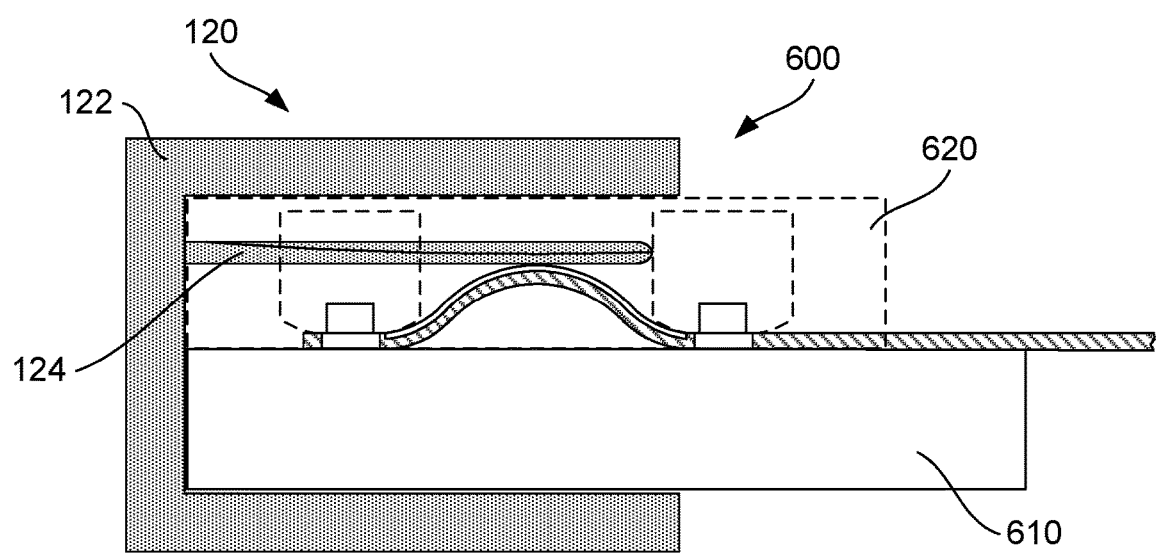

Once the flex circuit is secured in the arched configuration within connector 600, a module-side connector, such as module-side connector 120, may interface with circuit-side connector 600. FIG. 6F illustrates a cross-sectional view of module-side connector 120 interfacing with connector 600. As shown in FIG. 6F, module-side connector 120 comprises housing 122 and one or more male blades 124. Male blades 124 may terminate wiring or circuitry, or may be attached to a printed circuit board. The circuit-side connector 600 may be configured to be inserted into module-side connector housing 122, and blades 124 may be configured to be aligned with and inserted through a corresponding blade opening or openings in circuit-side connector 600. For example, such openings may be positioned within cover piece 620. Blades 124 may be inserted through or between each of clamp structure 622-A and structure 622-B as shown in FIG. 6F.

The arched configuration of the flex circuit may urge the conductive surface 110 or portions of the flex circuit upward against the male blades of the circuit-side connector. This ensures adequate contact between the male blades and the flex circuit. In some embodiments, it is possible that the height of the arched configuration of the flex circuit may be positioned above the level of the inserted male blades. However, due to the flexible nature of the flex circuit, the male blades may be pushed into the flex circuit to reshape the arched configuration of the flex circuit in the space below the inserted male blades.

Various structures in the base or upper portion of connector 600 may further restrict the movement of the inserted male blades, or even urge the male blades downward against the flex circuit. For example, cover 620 may optionally include a contact surface (surface 624 shown in dashed lines in FIG. 6D) between each clamp structure that gradually angles downward toward base 610. As such, the contact surface may urge the male blades downward as they are inserted into circuit-side connector 600.

Figure 7A:
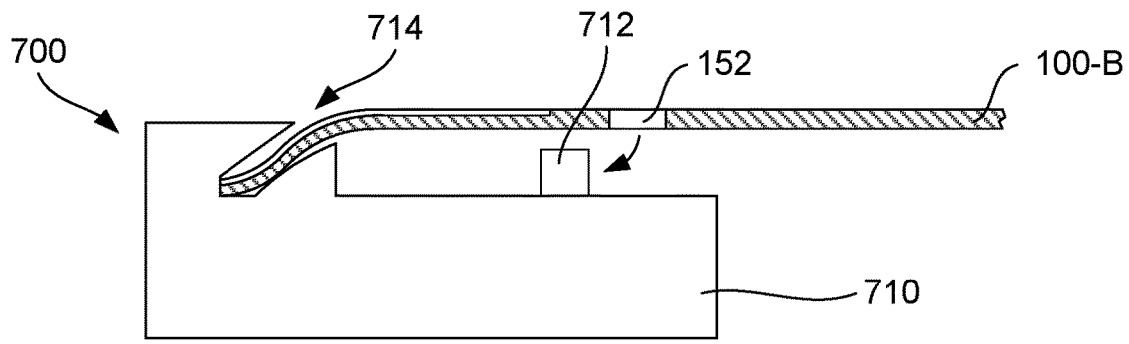
FIGS. 7A, 7B, and 7C illustrate various cross-sectional views of a circuit-side connector 700, in accordance with one or more embodiments.
Figure 7B:
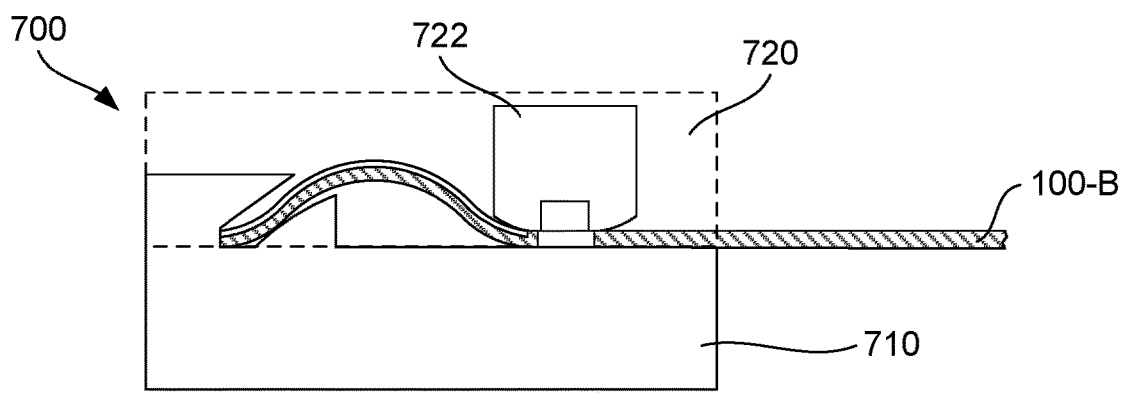
Figure 7C:
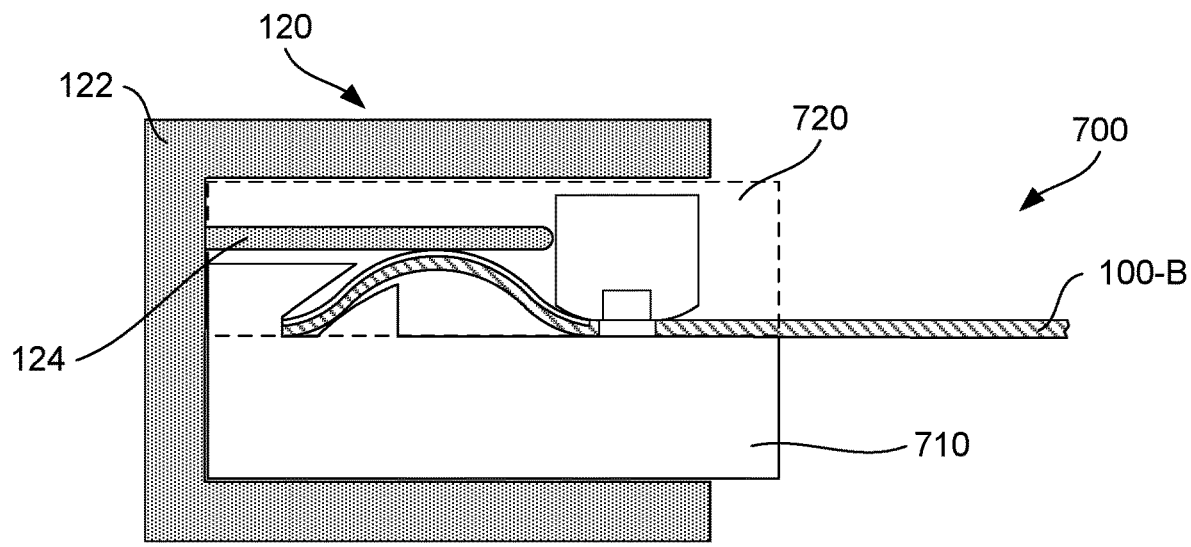

FIGS. 7A-7C illustrate various cross-sectional views of a circuit-side connector 700, in accordance with one or more embodiments. Connector 700 may comprise base 710 with a single set of protrusions 712 and an insertion cavity 714. Each protrusion of the set of protrusions 712 may be positioned on opposite sides of base 710 similar to protrusions 612-B. Insertion cavity 714 may be a space within base 710 configured to receive the front end of a flex circuit, such as flex circuit 100-B. In some embodiments insertion cavity 714 may be sloped downwards and may include a ramp or curved interior surface to support an upward arched configuration for the flex circuit 100-B.

Tab 152 is shown on flex circuit 100-B to indicate the relative position of corresponding apertures on flex circuit 100-B. The apertures on flex circuit 100-B at tab 152 may be configured to secure onto protrusions 712. This geometrical configuration would then result in an upward arched configuration of the flex circuit 100-B between the insertion cavity and the apertures.

Cover piece 720 may include clamp structure 722 similar in configuration and position to clamp structure 622-B. There may be a separate clamp structure 722 configured to interface with each protrusion 712. When cover piece 720 is securely attached to base 710, the clamp structure 722 may be configured to interface with the protrusions 712 to secure flex circuit 100-B in the arched configuration. In some embodiments, the geometry of the interfacing surface of the clamp structure 722 may be configured to further urge the flex circuit medially between the clamp structure and the insertion cavity to increase the height of the arched configuration.

Once the flex circuit is fully loaded into connector 700, connector 700 may interface with a circuit-side connector, such as connector 120. As previously described, blades 124 may be configured to be aligned with and inserted through a corresponding blade opening or openings in circuit-side connector 700, and the arched configuration of the flex circuit may urge the conductive surface 110 or portions of the flex circuit upward against the male blades of the circuit-side connector.

In various embodiments, a flex circuit may include additional sets of apertures located at different positions on the flex circuit to allow for selection or customization of a desired height of the arched configuration. For example an additional set of apertures may be located on flex circuit 100-A at a distance greater than distance B from the first set of apertures 150-A. This would increase the height of the arched configuration of the flex circuit when secured onto base 610. Conversely, an additional set of apertures may be located on flex circuit 100-A at a distance less than distance B from the first set of apertures 150-A. This would result in a lower height of the arched configuration when secured onto base 610.

In various embodiments, base 610 may include additional sets of protrusions located at different positions on the base to allow for selection or customization of a desired height of the arched configuration. For example, an additional set of protrusions may be located on base 610 at a distance greater than distance A from the first set of protrusions 612-A. This would reduce the height of the arched configuration of a given flex circuit when used to secure the flex circuit's apertures. Conversely, an additional set of protrusions may be located on base 610 at a distance less than distance A from the first set of protrusions 612-A. This would result in an increase in the height of the arched configuration when used to secure the flex circuit's apertures.

FIGS. 8A, 8B, 8C, and 8D illustrate a perspective view of a circuit-side connector 800 with a terminal position assurance (TPA) device, in accordance with one or more embodiments. In various embodiments, connector 800 comprises housing 810 defining housing chamber 804. Housing chamber 804 is shown in the cross-sectional view of FIGS. 8B and 8C with walls of housing 810 depicted in dashed lines. Housing 810 may further include one or more blade openings 816 passing through interface wall 860 into housing chamber 804, as well as one or more pin openings 818 passing through upper wall 862 into housing chamber 804. Connector 800 may include various elements within housing chamber 804. For example, insertion ramp 812 may be configured within the housing chamber. In some embodiments, insertion ramp 812 may define a portion of an insertion cavity, similar to insertion cavity 714, for receiving a flex circuit.

Figure 8A:
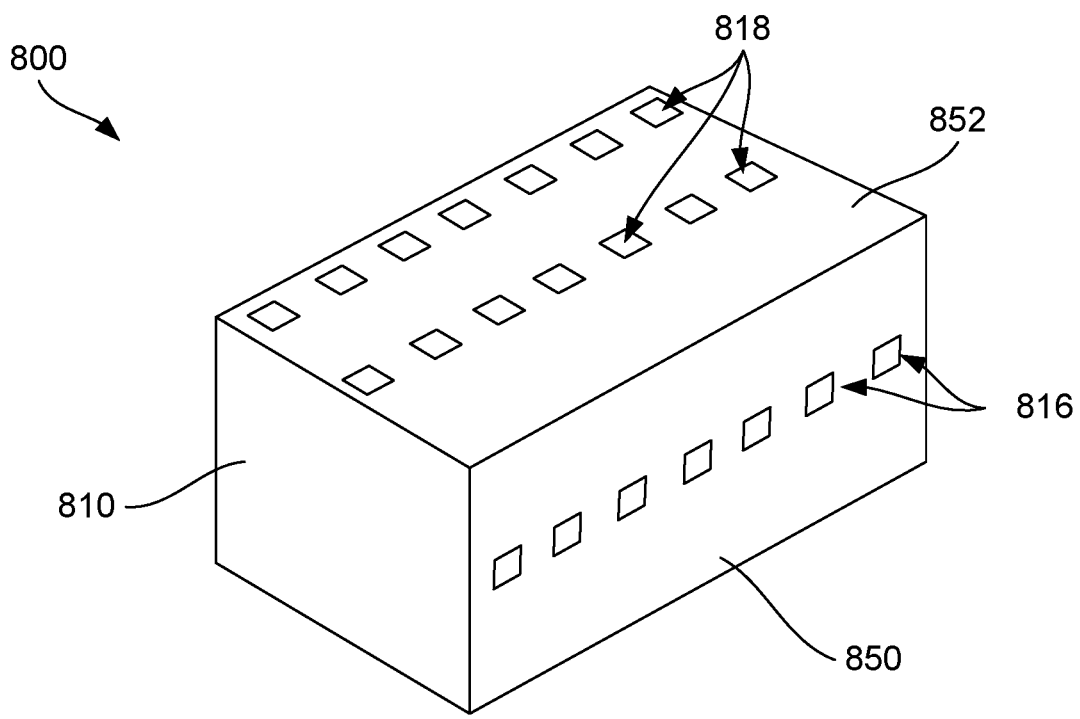
FIGS. 8A, 8B, 8C, and 8D illustrate a perspective view of a circuit-side connector with a terminal position assurance (TPA) device, in accordance with one or more embodiments.
Figure 8B:
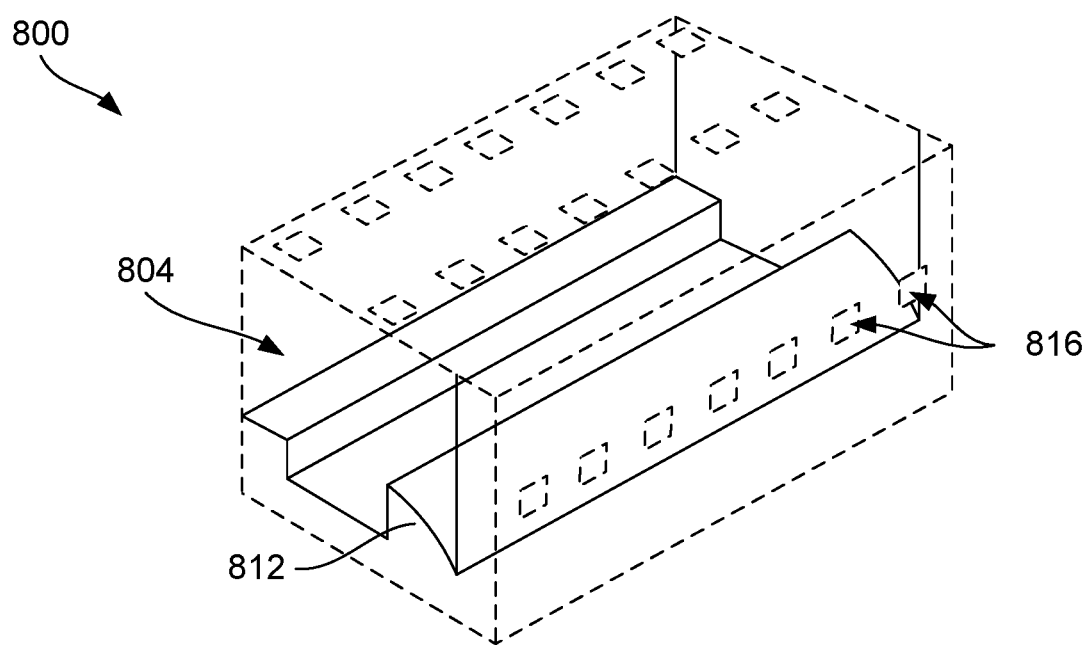
Figure 8C:
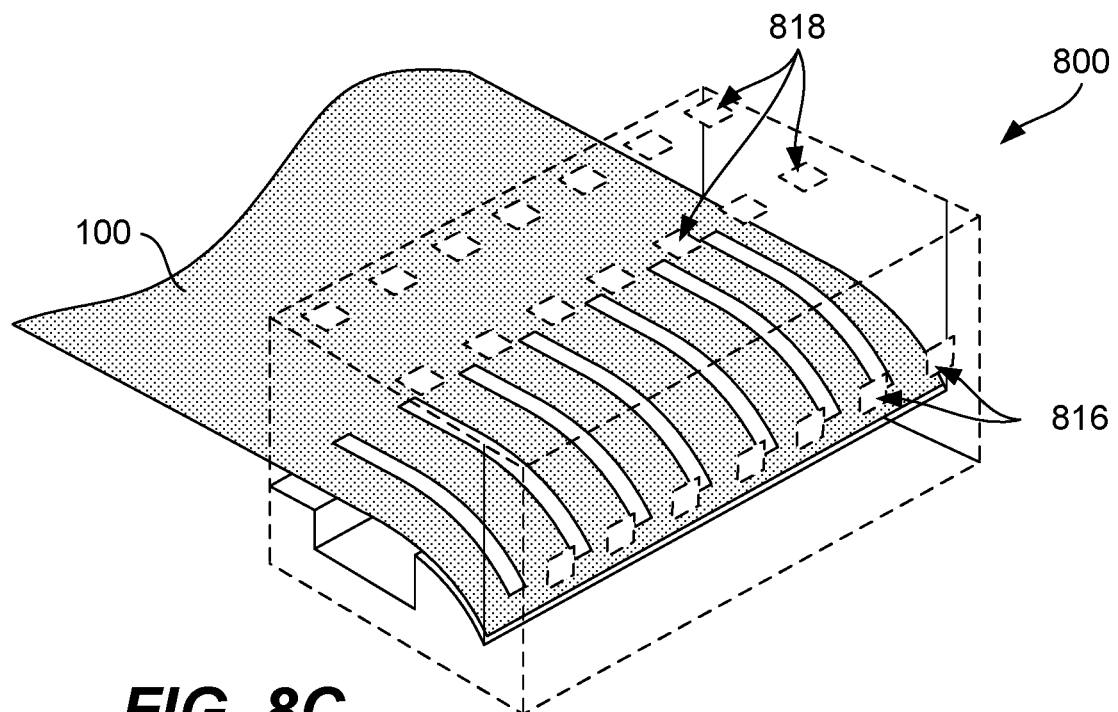
Figure 8D:
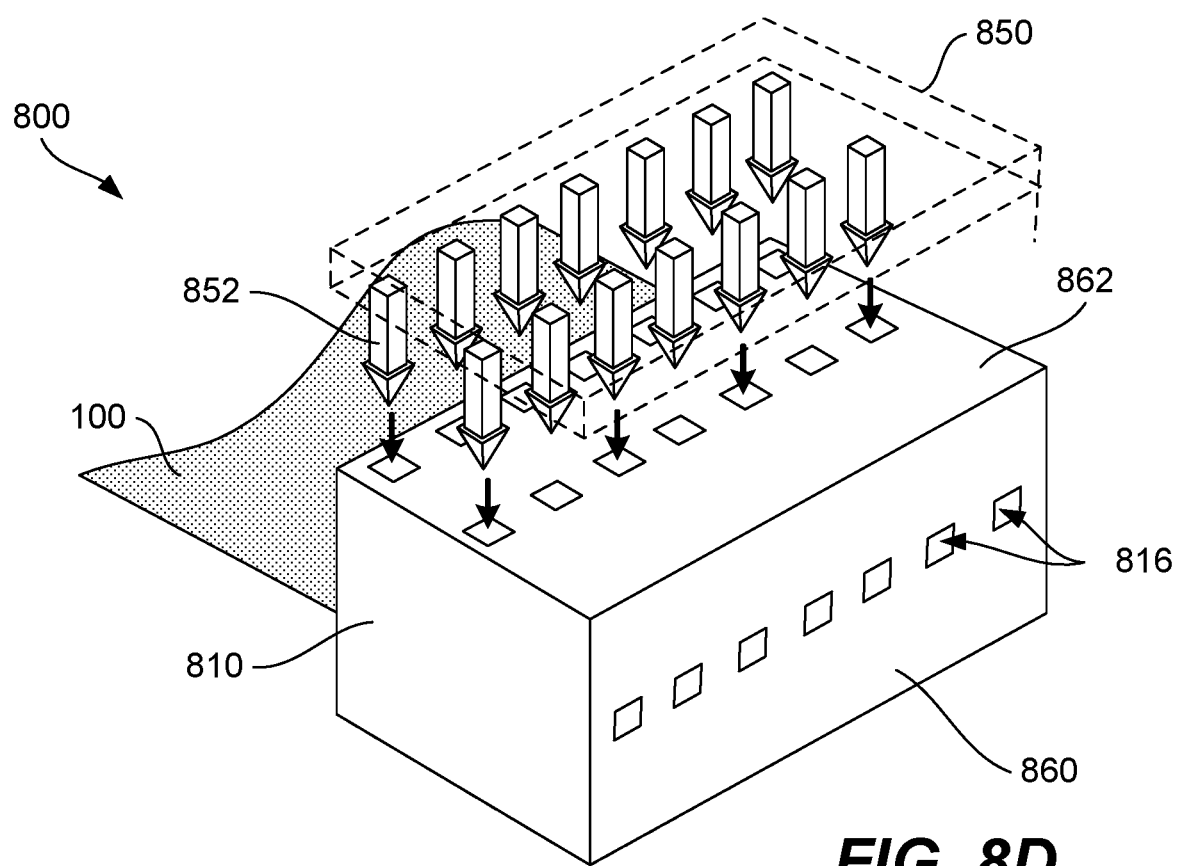

As shown in FIG. 8C, flex circuit 100 is inserted into housing 810 along insertion ramp 812. Once inserted, terminal position assurance (TPA) device 850 may then interface with housing 810. As shown in FIG. 8D, TPA device 850 comprises a structure with an interface surface 851 (shown in FIG. 8E) facing upper wall 862. The interface surface is configured with one or more pins 852 aligned with pin openings 818. In some embodiments, the TPA device is a separate structure. However, in some embodiments, the TPA device may be coupled to the housing 810 via pins 852 within pin openings 818. In such embodiments, the TPA device may be held together with the housing in an unsecured configuration.

Figure 8E:
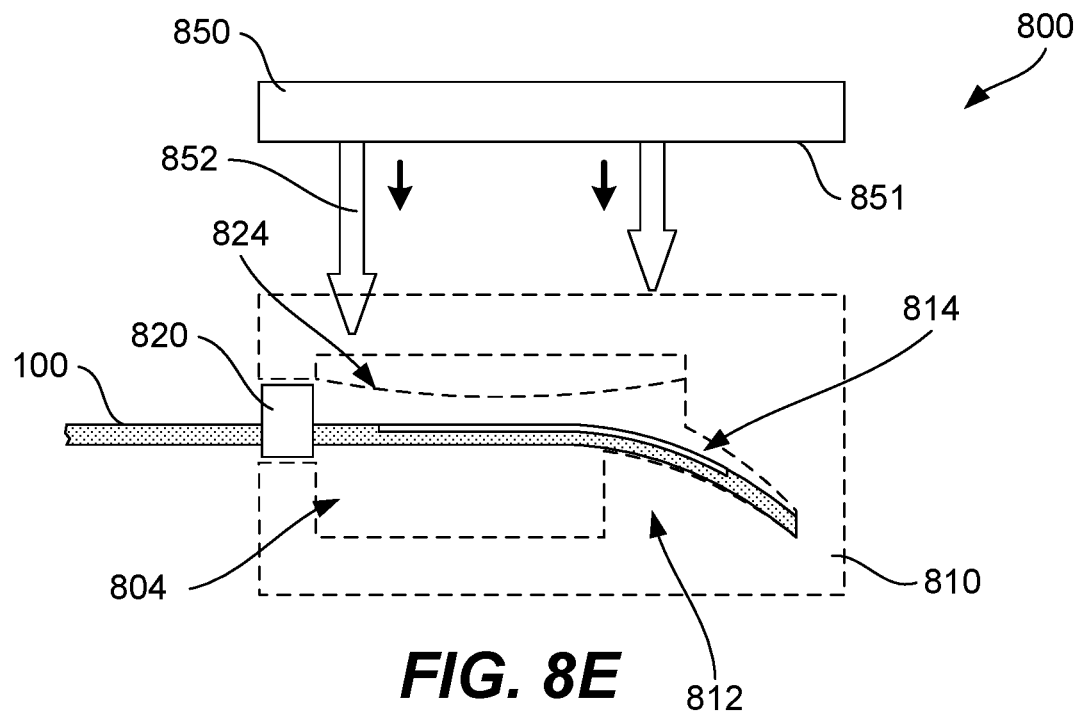
FIGS. 8E-8I illustrate various cross-sectional views of a circuit-side connector with a TPA device, in accordance with one or more embodiments.
Figure 8F:
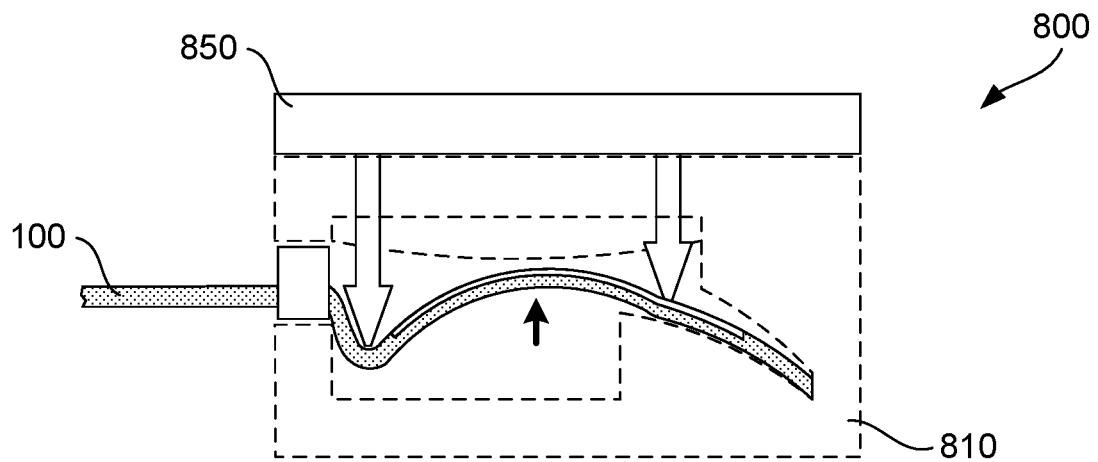

FIGS. 8E and 8F illustrate a cross-sectional view of connector 800. As shown, housing chamber 804 includes insertion cavity 814 formed, in, part by insertion ramp 812. The geometric profile of insertion ramp 812 may support an arched configuration of flex circuit 100 when the flex circuit is inserted into insertion cavity 814.

In some embodiments, seal 820 may be implemented to fix or secure the flex circuit's position within housing chamber 804. In particular embodiments, seal 820 is constructed from various materials, including various rubbers or plastics. In various embodiments, the type of material includes elastic properties allowing the material to flex such that when appropriate force is applied, seal 820 may press against the walls of housing 810 to act as a gasket between the surface of the flex circuit and the surfaces of the housing. In some embodiments, the seal 820 can form a water tight seal between the surfaces of the flex circuit and housing. In some embodiments, the flex circuit may move freely with respect to seal 820.

Figure 8G:
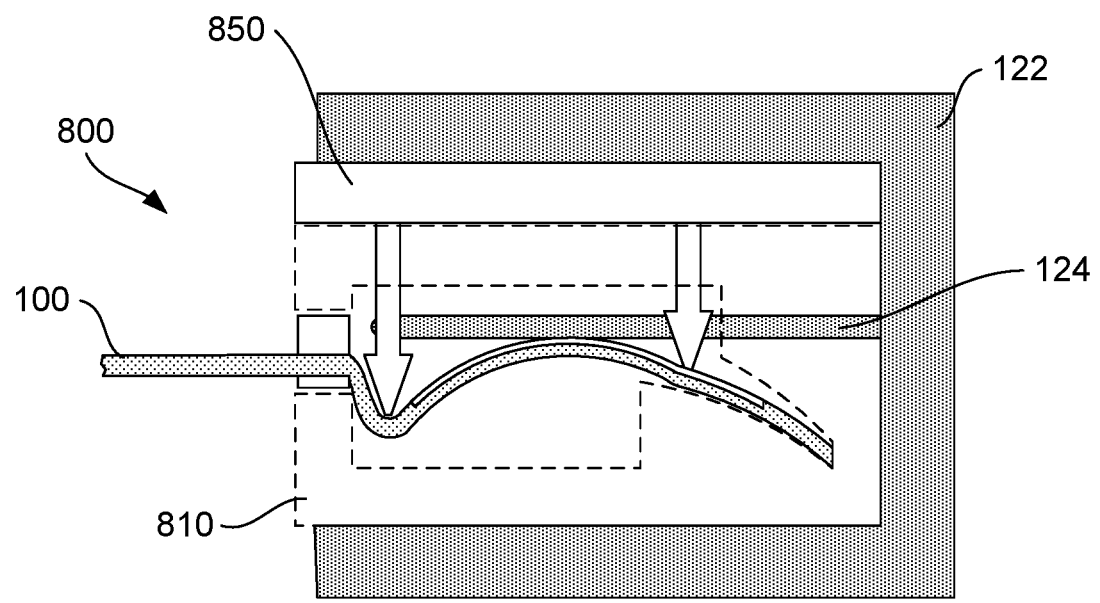

Once the flex circuit is fully inserted, TPA device 850 may be moved downward to interface with housing 810. As the TPA device moves downward, the pins may contact the flex circuit within the housing chamber. As the pins press down against the flex circuit, the force from the pins may increase the height of the arched configuration of the flex circuit, as shown in FIG. 8F. This upward-arched configuration ensures sufficient contact between inserted male blades 124 of interfaced module-side connector, as shown in FIG. 8G.

The male blades of the of module-side connector are inserted through blade openings 816. The blade openings may be aligned with the conductive portions 111 of the flex circuit. In some embodiments, the pins 852 may be aligned to be offset from the conductive portions 111, and the blade openings, of the flex circuit. Similar to cover 620 discussed above, the upper surface of the housing within housing chamber 804 may optionally include a contact surface (surface 824 shown in dashed lines in FIGS. 8E and 8F) around each pin opening that is convex or gradually angles downward toward the bottom of the housing chamber. As such, the contact surface may urge the male blades downward, against the flex circuit, as they are inserted into circuit-side connector.

Figure 8H:
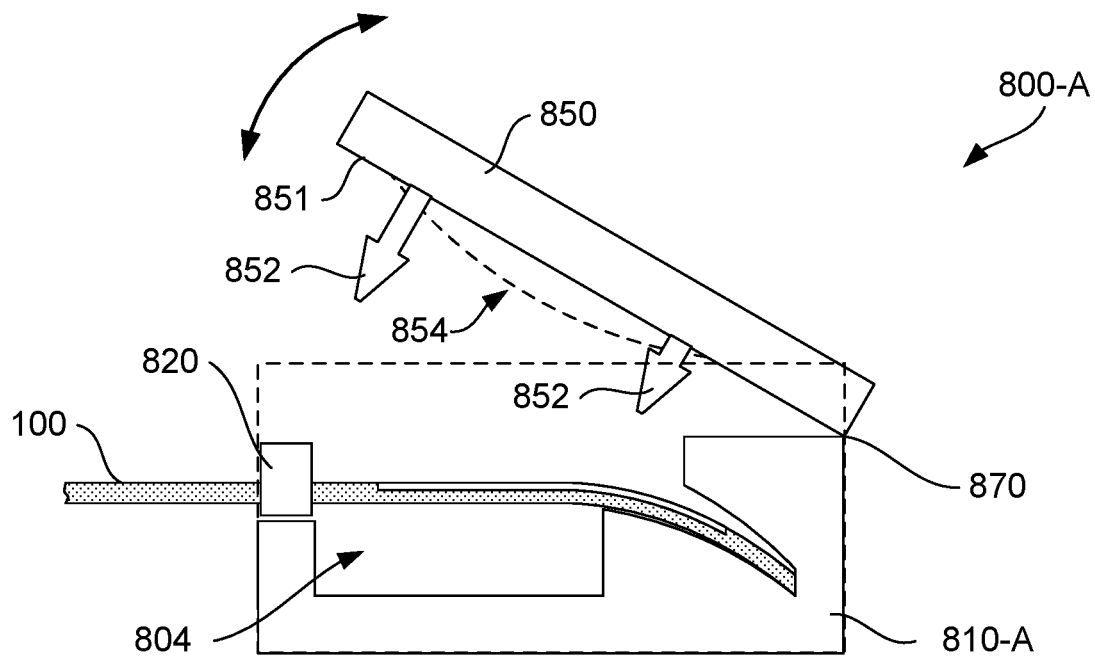
Figure 8I:
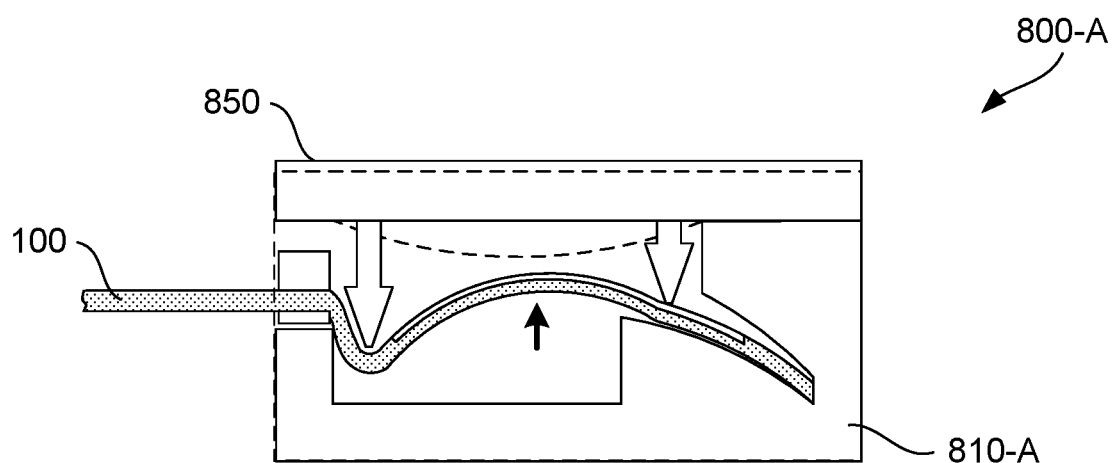

FIGS. 8H and 8I illustrate another embodiment of a circuit-side connector 800-A with a TPA device. As illustrated, housing 810-A of connector 800-A does not include an upper wall. Instead, TPA device 850 of connector 800-A is coupled to housing 810-A at hinge 870, and is configured to move between an open position and a closed position. In the open position, the housing chamber is exposed to allow for convenient loading of the flex circuit into the insertion cavity and can be secured in place with seal 820 or other adhesive, such as a pressure sensitive adhesive (PSA). The TPA device may then be moved into the closed position, effectively functioning as the upper wall, to enclose the housing cavity.

As the TPA device moves into the closed position, the pins contact the loaded flex circuit as previously described to increase the height of the arched configuration of the flex circuit. In some embodiments, the arched motion of the TPA device about hinge 870 may allow the pins closest to the hinge to contact the flex circuit first. This may serve to additionally secure the flex circuit within the housing chamber before the pins further away from the hinge press down into the flex circuit and increase or stabilize the arched configuration of the loaded flex circuit.

Here, the interface surface 851 of TPA device 850 may optionally include a contact surface (surface 854 shown in dashed lines in FIGS. 8H and 8I) that is convex or gradually angles downward toward the bottom of the housing chamber. As such, the contact surface may urge the male blades downward, against the flex circuit, as they are inserted into circuit-side connector.

Method of Operation

Figure 9:
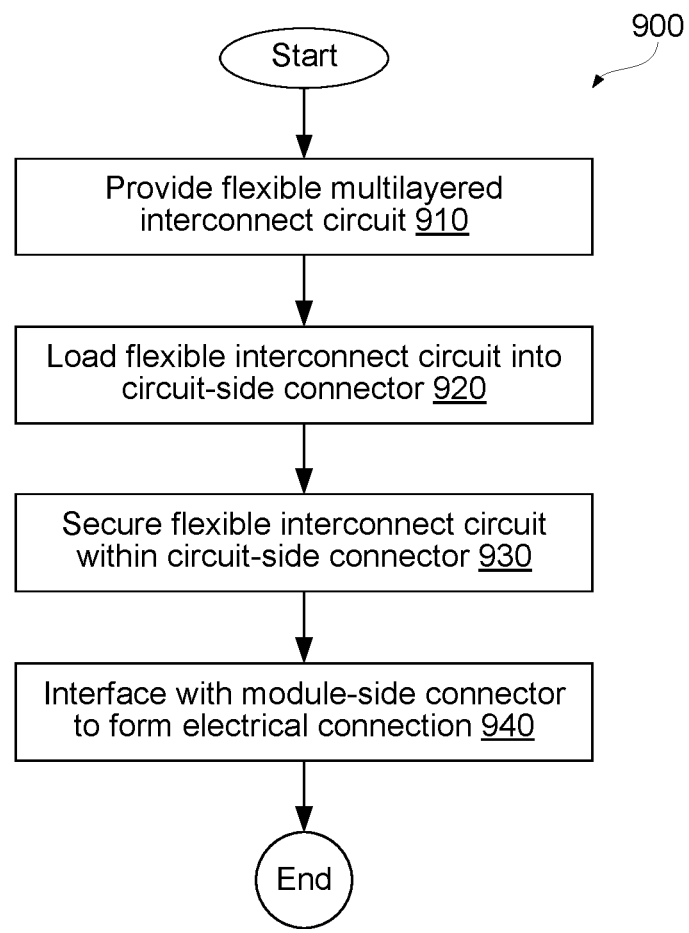
FIG. 9 is a process flowchart corresponding of a method for operating a circuit-side connector for a flexible interconnect circuit, in accordance with one or more embodiments.

FIG. 9 is a process flowchart corresponding to method 900 for operating a circuit-side connector for a flexible interconnect circuit, such as connectors 600, 700, 800, or 800-A, in accordance with one or more embodiments. Method 900 commences with (block 910) providing a flexible multilayered interconnect circuit, such as flex circuit 100-A. Various other examples of flex circuits are shown in FIGS. 1A, 2, 3, 4, 5, and 7A-C. As described in FIG. 6A, flexible multilayered interconnect circuit 100-A comprises at least two sets of apertures, such as apertures 150-A and apertures 150-B. In some embodiments, the apertures may be positioned within material on either side of the flex circuit. In some embodiments, the portions of the material are removed leaving tabs of material containing the apertures.

Method 900 then proceeds with (block 920) loading the flex circuit into circuit-side connector. One example of block 920 is schematically shown in FIGS. 6B and 6C where flex circuit 100-A is secured onto protrusions 612-A and 612-B at apertures 150-A and 150-B, respectively. This may cause the arched configuration of the flex circuit within the circuit-side connector housing as described. Another example of block 920 is schematically shown in FIGS. 7A and 7B, where flex circuit 100-B is placed into insertion cavity and secured onto protrusions 712 via apertures to create the arched configuration. Yet another example of block 920 is schematically shown in FIGS. 8E and 8H, where flex circuit 100 is placed within insertion cavity 814 within housing chamber 804.

Method 900 proceeds with (block 930) securing the flex circuit within the circuit-side connector. One example of block 930 is schematically shown in FIG. 6D, wherein cover 620 is secured onto base 610 such that clamp structures 622-A and 622-B interface with the protrusions and secure the flex circuit within the circuit-side connector. As previously described, cover 620 may be coupled to base 610 via a hinge mechanism as depicted in FIG. 6E, allowing cover 620 to move from an open position and a closed position to secure the flex circuit via clamp structures.

Another example of block 930 is schematically shown in FIG. 7B with cover 720 secured onto base 710. Yet another example of block 930 is schematically shown in FIGS. 8F and 8I, where TPA device 850 is interfaced with the circuit-side connector housing such that pins 852 secure the flex circuit within the housing. This may function to create an arched configuration as described.

Method 900 then proceeds with (block 940) interfacing with a module-side connector to form electrical connections. The module-side connector may include one or more electrically conductive male blades that can be inserted into corresponding openings in the circuit-side connector. One example of block 940 is schematically shown in FIG. 6F, where module-side connector 120 is interfaced with module-side connector 600 such that blades 124 are inserted into the module-side connector. The height of the arched configuration of the loaded flex circuit may be configured to contact the inserted male blades. Another example of block 940 is shown in FIGS. 7C and 8G. In some embodiments, the cover piece, housing, TPA device, or other component of the module-side connector may include a contact surface that further urges the male blades downward against the flex circuit when inserted.

As such, the described methods and systems provide a circuit-side connector configured to position the flex circuit in a manner to ensure a suitable electrical connection with a male blade of a module-side connector. As described herein, this can be done without first fitting the flex circuit with metal terminals. The described specially configured circuit-side connectors alone are sufficient to properly configure the flex circuit, thereby greatly reducing weight, size, and costs.

Conclusion

Although the foregoing concepts have been described in some detail for purposes of clarity of understanding, it will be apparent that certain changes and modifications may be practiced within the scope of the appended clauses. It should be noted that there are many alternative ways of implementing the processes, systems, and apparatus. Accordingly, the present examples are to be considered as illustrative and not restrictive.

What is claimed is:

1. An assembly comprising:
a flexible interconnect circuit; and
a connector connected to the flexible interconnect circuit and comprising:
a base comprising:
a housing chamber defined by at least a bottom wall, and
an insertion cavity within the housing chamber and partially defined by an insertion ramp, wherein a first part of the flexible interconnect circuit comprising a front end protrudes into the insertion cavity; and
a terminal position assurance (TPA) device interfacing with the base, wherein:
the TPA device comprises a first set of pins and a second set of pins positioned on an interface surface of the TPA device,
the first set of pins has a smaller offset relative to the front end of the flexible interconnect circuit than the second set of pins,
the first set of pins pushes the first part of the flexible interconnect circuit against the insertion ramp and clamps the first part between the first set of pins and the insertion ramp, and
the second set of pins extends into the housing chamber pressing on a second part of the flexible interconnect circuit without protruding through the flexible interconnect circuit thereby urging a portion of the flexible interconnect circuit, extending between the first part and the second part into an arched configuration.

2. The assembly of claim 1, further comprising a module-side connector comprising one or more blades, wherein:
the base further comprises one or more blade openings receiving the one or more blades of the module-side connector, and
the one or more blades of the module-side connector interface conductive portions of the flexible interconnect circuit.

3. The assembly of claim 2, wherein the connector further comprises a contact surface having a surface geometry urging the one or more blades of the module-side connector against the flexible interconnect circuit.

4. The assembly of claim 2, wherein the first set of pins and the second set of pins apply a force to the flexible interconnect circuit thereby increasing a height of the arched configuration.

5. The assembly of claim 2, wherein the arched configuration provides contact between the one or more blades of the module-side connector and the conductive portions of the flexible interconnect circuit.

6. The assembly of claim 2, wherein the one or more blade openings align with the conductive portions of the flexible interconnect circuit.

7. The assembly of claim 1, wherein the connector further comprises a seal configured to secure the flexible interconnect circuit within the housing chamber.

8. The assembly of claim 7, wherein the seal is operable as a gasket between the flexible interconnect circuit within the housing chamber.

9. The assembly of claim 7, wherein the seal is configured to form a watertight seal between the flexible interconnect circuit within the housing chamber.

10. The assembly of claim 1, wherein:
the insertion cavity of the base is at least partially defined by a contact surface and a bottom, and the contact surface surrounds the first set of pins and the second set of pins and faces the bottom such that the flexible interconnect circuit extends between the contact surface and the bottom.

11. The assembly of claim 10, wherein the contact surface is convex or gradually angles downward toward the bottom.

12. The assembly of claim 1, wherein:
the base further comprises an upper wall defining the housing chamber,
the upper wall comprises a plurality of pin openings,
the interface surface of the TPA device interfaces with an external surface of the upper wall, and
the first set of pins and the second set of pins pass through the plurality of pin openings in the upper wall.

13. The assembly of claim 1, wherein the connector further comprises a hinge, pivotably coupling the TPA device and the base.

14. The assembly of claim 1, wherein the TPA device is a separate component from the base.

15. The assembly of claim 1, wherein each of the first set of pins and the second set of pins comprises multiple pins offset with each other in a direction parallel to the front end of the flexible interconnect circuit.

16. The assembly of claim 1, wherein the insertion ramp has a geometric profile defining, at least in part, the arched configuration of the portion of the flexible interconnect circuit, extending between the first part and the second part.

17. The assembly of claim 1, wherein each of the each of the first set of pins and the second set of pins apply forces on the flexible interconnect circuit defining a height of the arched configuration of the portion of the flexible interconnect circuit, extending between the first part and the second part.

18. The assembly of claim 1, wherein each of the each of the first set of pins and the second set of pins is offset from conductive portions of the flexible interconnect circuit.

19. The assembly of claim 1, wherein the second set of pins protrudes further away from the interface surface of the TPA device than the first set of pins.

20. The assembly of claim 1, wherein the flexible interconnect circuit comprises conductive portions formed from aluminum.

\* \* \* \* \*